(12) United States Patent
Nomura et al.

(10) Patent No.: US 7,952,058 B2
(45) Date of Patent: May 31, 2011

(54) RADIATION DETECTION APPARATUS AND RADIATION DETECTION SYSTEM HAVING A LIGHT SOURCE LOCATED TO REDUCE DARK CURRENT

(75) Inventors: Keiichi Nomura, Honjo (JP); Yoshihiro Ogawa, Hachioji (JP); Satoshi Okada, Zama (JP); Masato Inoue, Kumagaya (JP); Shinichi Takeda, Honjo (JP); Kazumi Nagano, Fujisawa (JP); Satoru Sawada, Kodama-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 444 days.

(21) Appl. No.: 12/091,088

(22) PCT Filed: Dec. 19, 2006

(86) PCT No.: PCT/JP2006/325684
§ 371 (c)(1),
(2), (4) Date: Apr. 22, 2008

(87) PCT Pub. No.: WO2007/072963
PCT Pub. Date: Jun. 28, 2007

(65) Prior Publication Data
US 2009/0289170 A1 Nov. 26, 2009

(30) Foreign Application Priority Data

Dec. 20, 2005 (JP) .................. 2005-367190
Dec. 14, 2006 (JP) .................. 2006-337588

(51) Int. Cl.
*G01J 1/44* (2006.01)

(52) U.S. Cl. .................. 250/208.1; 250/239; 250/370.11; 250/370.14

(58) Field of Classification Search ............... 250/208.1, 250/239, 370.11, 370.14
See application file for complete search history.

(56) References Cited

U.S. PATENT DOCUMENTS

| | | | |
|---|---|---|---|
| 5,905,772 A | 5/1999 | Rutten et al. | |
| 6,969,861 B2 * | 11/2005 | Shoji et al. | 250/370.11 |
| 6,995,375 B2 | 2/2006 | Sato et al. | 250/370.12 |
| 7,205,547 B2 | 4/2007 | Ishii et al. | 250/370.09 |
| 7,205,568 B2 | 4/2007 | Watanabe et al. | 257/59 |

(Continued)

FOREIGN PATENT DOCUMENTS

CN    1484321 A    3/2004

(Continued)

OTHER PUBLICATIONS

Int'l Search Report mailed Mar. 27, 2008, for International Application No. PCT/JP2006/325684.

(Continued)

*Primary Examiner* — Seung C Sohn
(74) *Attorney, Agent, or Firm* — Fitzpatrick, Cella, Harper & Scinto (57) ABSTRACT

A radiation detection apparatus to detect radiation. A substrate (1) has a conversion element on a first surface. The conversion element is configured to convert radiation into electric charges. A readout circuit is connected to a first region. The first region includes a first edge of the first surface. A driving circuit is connected to a second region other than the first region. The second region includes a second edge of the first surface. A light source (4) is arranged on a second surface side which faces the first surface. The light source (4) is arranged so as to face any regions of the second surface side except the first region.

15 Claims, 9 Drawing Sheets

U.S. PATENT DOCUMENTS

| | | |
|---|---|---|
| 7,256,404 B2 | 8/2007 | Inoue et al. ............... 250/370.11 |
| 7,315,027 B2 | 1/2008 | Okada et al. ............. 250/370.11 |
| 7,381,965 B2 | 6/2008 | Ishii et al. ................. 250/370.11 |
| 7,435,968 B2 | 10/2008 | Watanabe et al. ........ 250/370.14 |
| 2001/0035911 A1 | 11/2001 | Sato et al. |
| 2002/0044211 A1 | 4/2002 | Tujii et al. |
| 2003/0026382 A1 | 2/2003 | Takeda |
| 2004/0183025 A1 | 9/2004 | Sato |
| 2005/0173645 A1 | 8/2005 | Endo |
| 2006/0033031 A1 | 2/2006 | Takeda et al. ............ 250/370.11 |
| 2006/0033040 A1 | 2/2006 | Okada et al. ............... 250/484.2 |
| 2006/0062352 A1 | 3/2006 | Nomura et al. .............. 378/98.8 |
| 2006/0065944 A1 | 3/2006 | Mochizuki et al. ........... 257/444 |
| 2006/0249763 A1 | 11/2006 | Mochizuki et al. ........... 257/291 |
| 2007/0069107 A1 | 3/2007 | Ishii et al. ................... 250/208.1 |
| 2007/0131867 A1 | 6/2007 | Okada et al. ............. 250/370.09 |
| 2007/0146520 A1 | 6/2007 | Watanabe et al. ............. 348/308 |
| 2007/0205371 A1 | 9/2007 | Inoue ....................... 250/370.11 |
| 2007/0257198 A1 | 11/2007 | Ogawa et al. ............ 250/370.11 |
| 2008/0083877 A1 | 4/2008 | Nomura et al. .......... 250/370.11 |
| 2008/0099688 A1 | 5/2008 | Ishii et al. ................ 250/370.08 |
| 2008/0308739 A1 | 12/2008 | Sawada et al. ............ 250/370.11 |

FOREIGN PATENT DOCUMENTS

| | | |
|---|---|---|
| EP | 1 179 741 A2 | 2/2002 |
| EP | 1 467 227 A1 | 10/2004 |
| JP | 5-75012 | 3/1993 |
| JP | 2001-313384 A1 | 11/2001 |
| JP | 2002-040144 A1 | 2/2002 |
| JP | 2002-165142 A1 | 6/2002 |
| JP | 2003-121553 A1 | 4/2003 |
| JP | 2004-33659 A2 | 2/2004 |
| JP | 2004-146769 A2 | 5/2004 |
| JP | 2004-281882 A1 | 10/2004 |
| JP | 2005-175526 A1 | 6/2005 |
| JP | 2005-283261 A2 | 10/2005 |
| JP | 2005-308440 A2 | 11/2005 |
| WO | WO 98/01992 A2 | 1/1998 |
| WO | WO 2004/073068 A1 | 8/2004 |
| WO | WO 2005/0055591 A1 | 6/2005 |

OTHER PUBLICATIONS

Written Opinion of the International Searching Authority mailed Mar. 27, 2008, for International Application No. PCT/JP2006/0325684.

PCT Written Opinion of the International Preliminary Examining Authority mailed Dec. 25, 2007, for International Application No. PCT/JP2006/325684.

Please note: EP 1702458 and JP 5-75012 are not available.

\* cited by examiner

RADIATION DETECTION APPARATUS AND RADIATION DETECTION SYSTEM HAVING A LIGHT SOURCE LOCATED TO REDUCE DARK CURRENT

This Application is a National Stage filing under 35 U.S.C. §371 of International Application No. PCT/JP2006/325684, filed Dec. 19, 2006.

TECHNICAL FIELD

The present invention relates to a radiation detection apparatus and a radiation detection system, and more particularly, to an apparatus and a system that can serve, for example, as a medical diagnosis apparatus and a nondestructive inspection apparatus.

BACKGROUND ART

As TFT technology used for liquid crystal displays progresses, and the information infrastructure expands these days, various kinds of flat panel detectors (to be referred to as "FPDs" hereinafter) have been proposed, and achieved a large screen size and digitization even in the field of medical imaging.

The FPD can instantaneously read out a radiation image and display it on a display screen. The FPD can also directly extract an image as digital information. This enables convenient data handling, i.e., facilitates saving, manipulation, and transmission of data. It has been confirmed that characteristics such as sensitivity are equal to or greater than those of conventional screen film imaging and computed radiography, though the characteristics depend on the imaging conditions.

Japanese Patent Laid-Open No. 2002-40144 discloses a photoelectric conversion apparatus with a light source. This apparatus improves usability by suppressing a characteristic variation in extended use and decreases S/N ratio caused by a dark current and shortens the imaging cycle by using the light source.

U.S. Pat. No. 5,905,772 and Japanese Patent Laid-Open No. 2004-33659 disclose an X-ray detection apparatus with a light source.

Japanese Patent Laid-Open No. 2004-146769 discloses attaching a light guiding layer to a back surface of a TFT substrate by means of, e.g., a transparent adhesive.

Japanese Patent Laid-Open No. 2005-308440 discloses an electromagnetic shield that covers the periphery of a light irradiation means. Japanese Patent Laid-Open No. 2005-308440 also discloses storing an illuminous body and a lighting circuit in the light irradiation means.

The above-mentioned patent references, however, do not disclose a method of optimizing a mounting position and a mounting method of the light source. In the prior art, the light source and a driving circuit of driving source thereof are arranged near a readout circuit to read out an image signal, and a signal wire of the readout circuit. Heat, the driving signal itself, and vibrations from the light source of driving circuit thereof may generate noise in the image signal. There is a need for measures against this problem.

DISCLOSURE OF INVENTION

It is an object of the present invention to suppress noise generated by a readout circuit for reading out signals from a conversion element.

A first aspect of the present invention is associated with a radiation detection apparatus, and is characterized by comprising a substrate having a conversion element on a first surface, the conversion element configured to convert radiation into electric charges; a readout circuit connected to a first region, the first region including a first edge of the first surface; a driving circuit connected to a second region other than the first region, the second region including a second edge of the first surface; and a light source arranged on a side of a second surface of the substrate side which opposes the first surface of the substrate, wherein the light source is arranged so as to face the second region or arranged on the second surface.

A second aspect of the present invention is associated with a radiation detection system, and comprises the above radiation detection apparatus, a signal processing unit configured to process a signal from the radiation detection apparatus, a recording unit configured to record a signal from the signal processing unit, a display unit configured to display a signal from the signal processing unit, and a transmission unit configured to transmit a signal from the signal processing unit.

Further features of the present invention will become apparent from the following description of exemplary embodiments (with reference to the attached drawings).

BEST MODE FOR CARRYING OUT THE INVENTION

Preferred embodiments of the present invention will now be described in detail with reference to the drawings. It should be noted that the relative arrangement of the components and the numerical expressions and numerical values set forth in these embodiments do not limit the scope of the present invention unless it is specifically stated otherwise.

The preferred embodiments of the present invention can be applied to a radiation detection apparatus and a radiation detection system, which can be used for a medical diagnosis apparatus, a nondestructive inspection apparatus and an analytical apparatus. The radiation detection apparatus and radiation detection system detect radiation such as X-, α-, β-, and γ-rays. More specifically, the preferred embodiments of the present invention can be applied to a radiation detection apparatus and a radiation detection system, which is utilized for an FPD. The FPD comprises a sensor array having a switching element and a phosphor. The switching element may be a TFT using amorphous silicon. The phosphor converts radiation into visible light, etc.

First Embodiment

Figure 1:
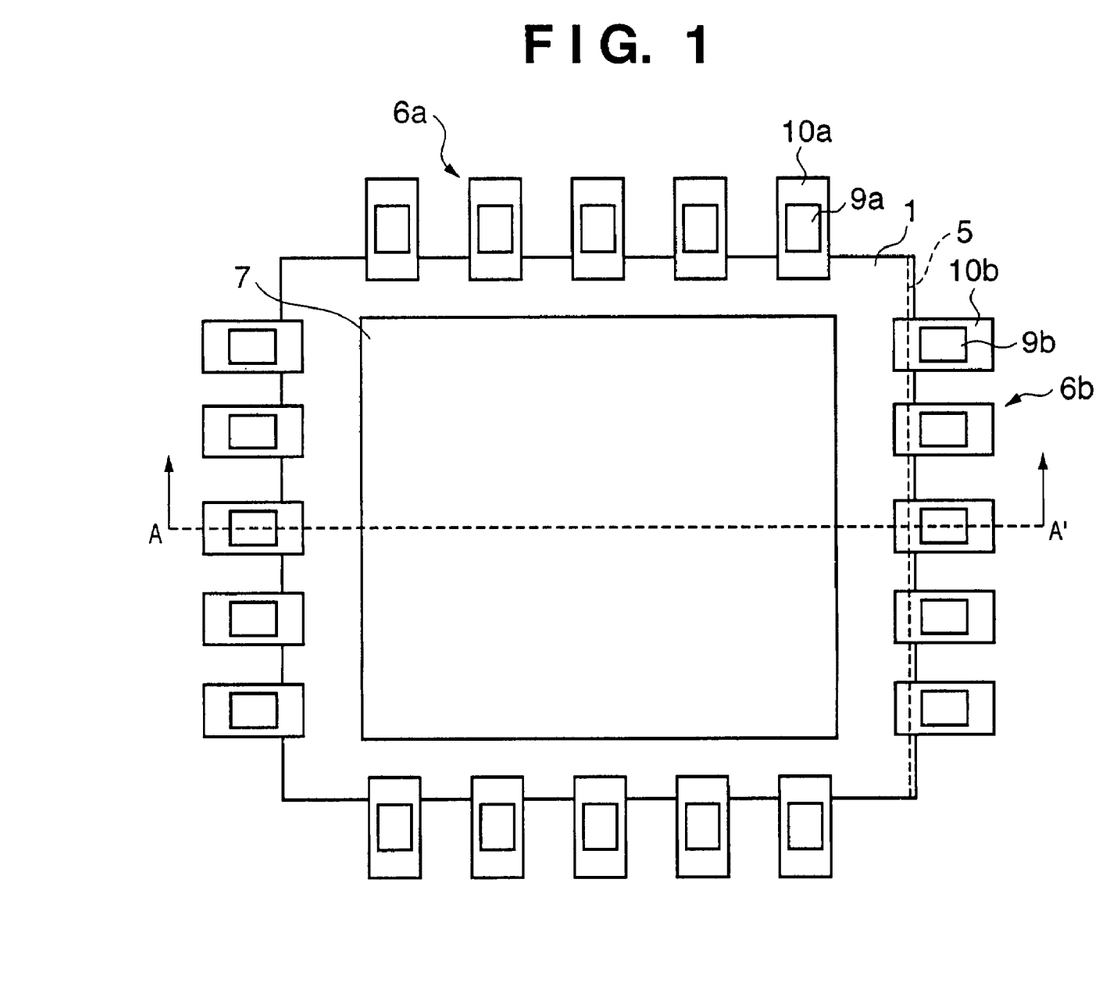
FIG. 1 is a schematic plan view of a preferred first embodiment of the present invention.
Figure 2:
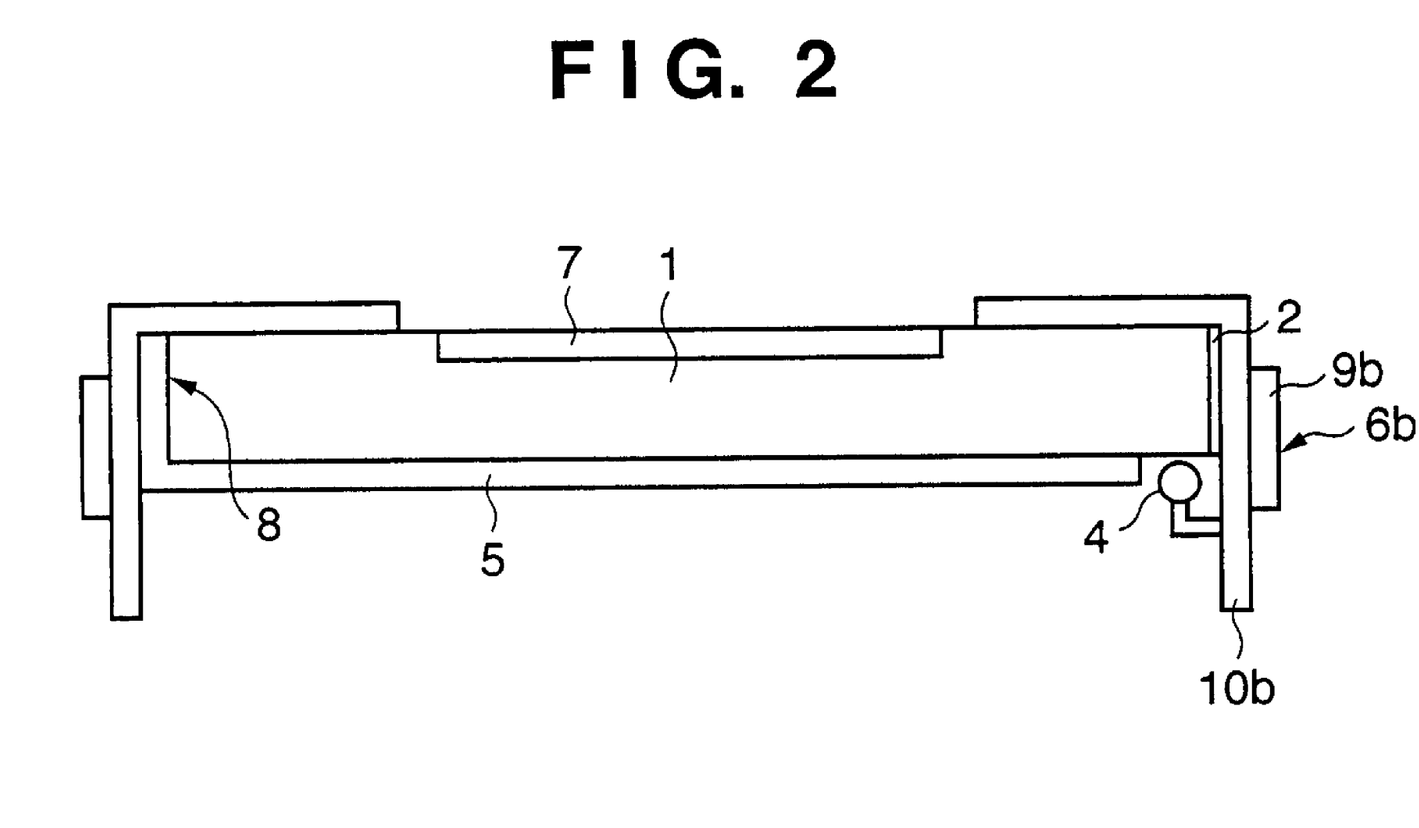
FIG. 2 is a cross-sectional view (section A-A') of a preferred first embodiment of FIG. 1.

A radiation detection apparatus according to the preferred first embodiment of the present invention will now be described. FIG. 1 is a schematic plan view showing the radiation detection apparatus according to the preferred first embodiment of the present invention. For convenience of explanation, electric components 6a and 6b are arranged in a plane. FIG. 2 is a cross-sectional view (section A-A') of the radiation detection apparatus of FIG. 1. The electric components 6a and 6b are mounted and arranged on the edge of a substrate 1. The substrate 1 is an example of a support substrate. The electric components 6a and 6b may be arranged on the substrate 1 without being bent and then the electric components 6a and 6b may be bent as shown in FIG. 2. Alternatively, the electric components 6a and 6b may be previously bent and then mounted on the substrate 1. This may apply to other embodiments.

In FIG. 1 and FIG. 2, the substrate 1 is an insulating substrate having a plurality of pixels. Each pixel has a conversion element which converts radiation into electric charges and a switching element such as a TFT. The insulating substrate 1 (a sensor substrate or a support substrate) comprises glass, etc. An adhesion layer 2 comprises acrylic resin, or epoxy resin etc. A light source 4 comprises an LED or a cold-cathode tube, etc. A reflective layer 5 comprises reflective dots, a micro-reflector, a PET or a reflective sheet using polycarbonate, or a mixture thereof. The electric component 6a has a tape carrier package (to be referred to as "TCP" hereinafter) 10a and a chip 9a thereon. A readout circuit is formed on the chip 9a. The readout circuit reads out a signal, which is generated by the conversion element and transferred to the switching element. The electric component 6b has a TCP 10b and a chip 9b thereon. A driving circuit is formed on the chip 9b. The driving circuit drives the conversion element. A pixel area 7 includes a plurality of pixels arranged therein. An edge reflective layer 8 is formed on the edge of the substrate 1. The driving circuit of the chip 9b is generally mounted on an edge other than the edge on which the readout circuit of the chip 9a and signal wires thereof are arranged. Thus, the electric components 6a and 6b are arranged on different edges of the substrate 1 respectively.

The light source 4 is arranged to face the opposite side (backside) to the side on which the conversion element of the substrate 1 is located, so as to reduce a dark current of the conversion element. Further, the light source 4 is located away from the electric component 6a and the readout circuit thereof. In a case where such an arrangement is used, the light source 4 should preferably not be arranged in the region of the surface of the substrate 1 on which the electric component 6a is located. The light source 4 should preferably be arranged in the region of the surface of the substrate 1 on which the electric component 6b is located. Such arrangements can be realized simply by attaching the light source 4 to the exposed surface of the substrate side of the electric component 6b as shown in FIG. 2. Since the electric component 6a is located away from the light source 4, it is possible to suppress noise generated by the readout circuit of the electric component 6a due to heat generated by the light source 4 or the driving circuit thereof. It should be noted that the light source 4 should not necessarily be arranged at the corner or near the corner of the substrate 1. This is because such regions are located close to the readout circuit and may cause noise problems.

The conversion element may be a photoelectric conversion element such as a pin photodiode or an MIS sensor using amorphous silicon. The photoelectric conversion element is used in combination with a phosphor (e.g., CsI, GOS). The phosphor acts as a scintillator for converting radiation into light at a wavelength range which can be sensed by the conversion element. The phosphor may be stacked so as to cover the conversion element and TFT, etc., which are formed on the substrate 1. The conversion element may also be a conversion element using amorphous Se, which can directly convert radiation into electric charges.

The light source 4 may be a light source, which can be used for a back light of a flat panel, such as an LED light source, a cold-cathode tube or an EL light source, etc. The wavelength of the light source 4 is not limited to the visible light, but includes infrared light and ultraviolet light, etc. The LED light source is preferable because of its low cost and thin structure. The light source may be a blue LED, a blue-green LED, a green LED, a yellow LED, an orange LED, a red LED, etc., or a white LED fabricated by a mixture thereof.

The light source 4 may be mounted on the TCP 10b of the electric component 6b and electrically connected. This mounting enables the light source 4 to be mounted simply without an additional component such as a new PCB board, etc.

The electric component 6a is electrically connected to a pad portion on the substrate 1 using an anisotropic conductive film (ACF) (not shown) and fixed to the edge of the substrate 1 by an adhesion layer 2. If the electric component 6b is not attached to the substrate 1, then the light amount changes over time and variation in the location occurs when the sensor panel and a light source 4 thereof vibrates. On the other hand, when the electric component 6b is attached to the substrate 1, the vibration of the light source 4 decreases and this causes the change of the light amount and the variation in the location to be reduced. Although the substrate 1 is described as an insulating substrate such as a glass by way of example, it is more preferable to use materials which act as a light guiding layer.

The reflective layer 5 comprises, for example, reflective dots and a reflective sheet. The reflective dots comprise a reflective ink which is a mixture of a binder and a pigment with high reflectance and low optical absorption such as $TiO_2$ or $BaSo_4$. The reflective sheet causes light components, which are incident on the reflective dots and travel toward the backside of the substrate 1, to be directed to the front side of the substrate 1. The reflective sheet may preferably be a material with high reflectance.

The reflective layer 5 may also comprise a micro reflector and a reflective sheet. The inner propagation light, which propagates in the substrate 1, travels to the micro reflector and arrives inside the micro reflector. The light inside the micro reflector is refracted and exits through the exit surface in a direction substantially perpendicular to the front side.

Described below is the operation of the light source 4. The light emitted from the light source 4 travels inside the substrate 1 by total reflection and changes direction when striking the reflective dots or the micro reflector. As a result, if the angle of the light components is changed to an angle greater than the critical angle (beyond which no refracted light is possible), the light component exits from the surface of the substrate 1. The light exited from the substrate 1 is reflected by the phosphor and incident on the pixel region 7. Alternatively, a part of light is directly incident on the pixel region 7 from between pixels in an oblique direction.

The edge reflective sheet used for the edge reflective layer 8 prevents total reflection light, which is reflected at parallel surfaces of the substrate 1, from emerging to the opposite surface and enhances the utilization efficiency of the light.

Described below is the operation of the light when radiation is converted into light by the phosphor and emerges from in between pixels without being absorbed by the photoelectric conversion element of the pixel region 7. If the light emerges from in between pixels without being absorbed by the photoelectric conversion element of the pixel region 7, the light passes through the substrate 1 and arrives at the reflective layer 5. The reflective layer 5 doubles as a diffusion plate and prevents light which is scattered and reflected at the reflective layer 5 toward the pixel region 7 inside the substrate 1.

In accordance with the present embodiment of the invention, since a light source is located away from a readout circuit, it is possible to suppress noise generated by the readout circuit due to heat generated by the light source or the driving circuit thereof. Further, it is possible to realize simple and low cost mounting by implementing the optimal mounting location and method thereof.

Second Embodiment

Figure 3:
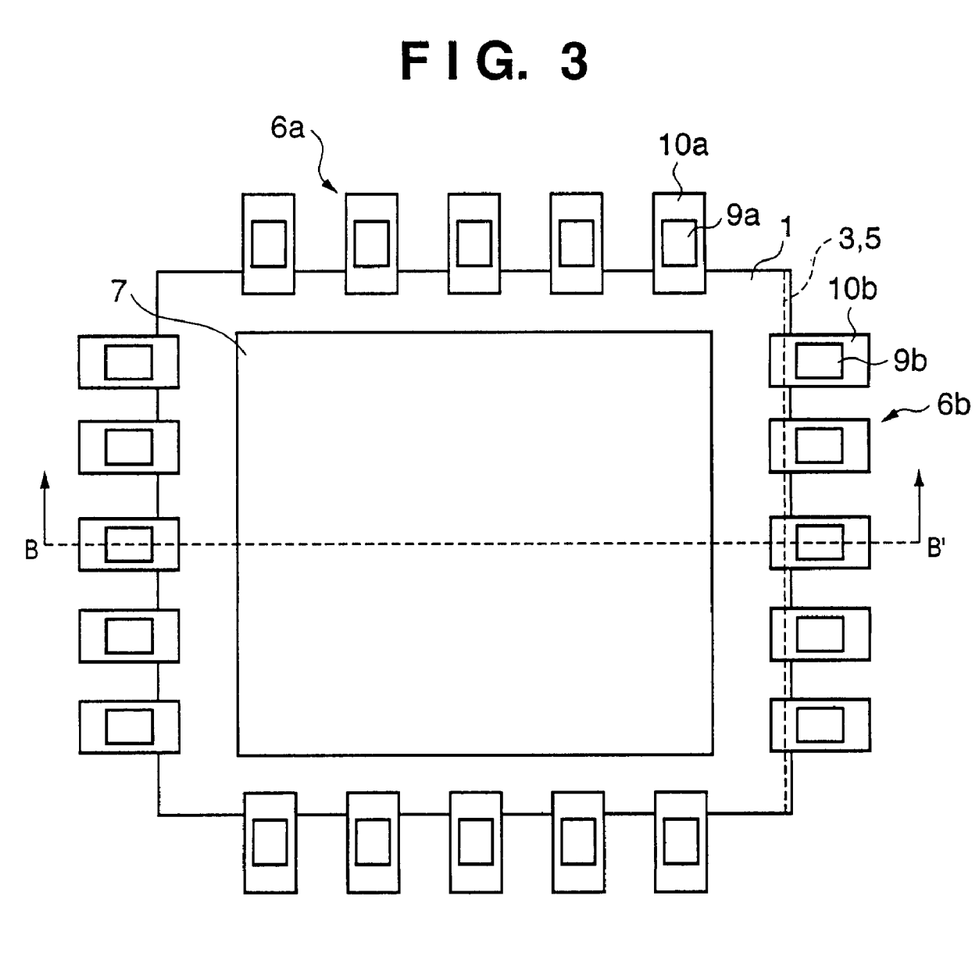
FIG. 3 is a schematic plan view of a preferred second embodiment of the present invention.
Figure 4:
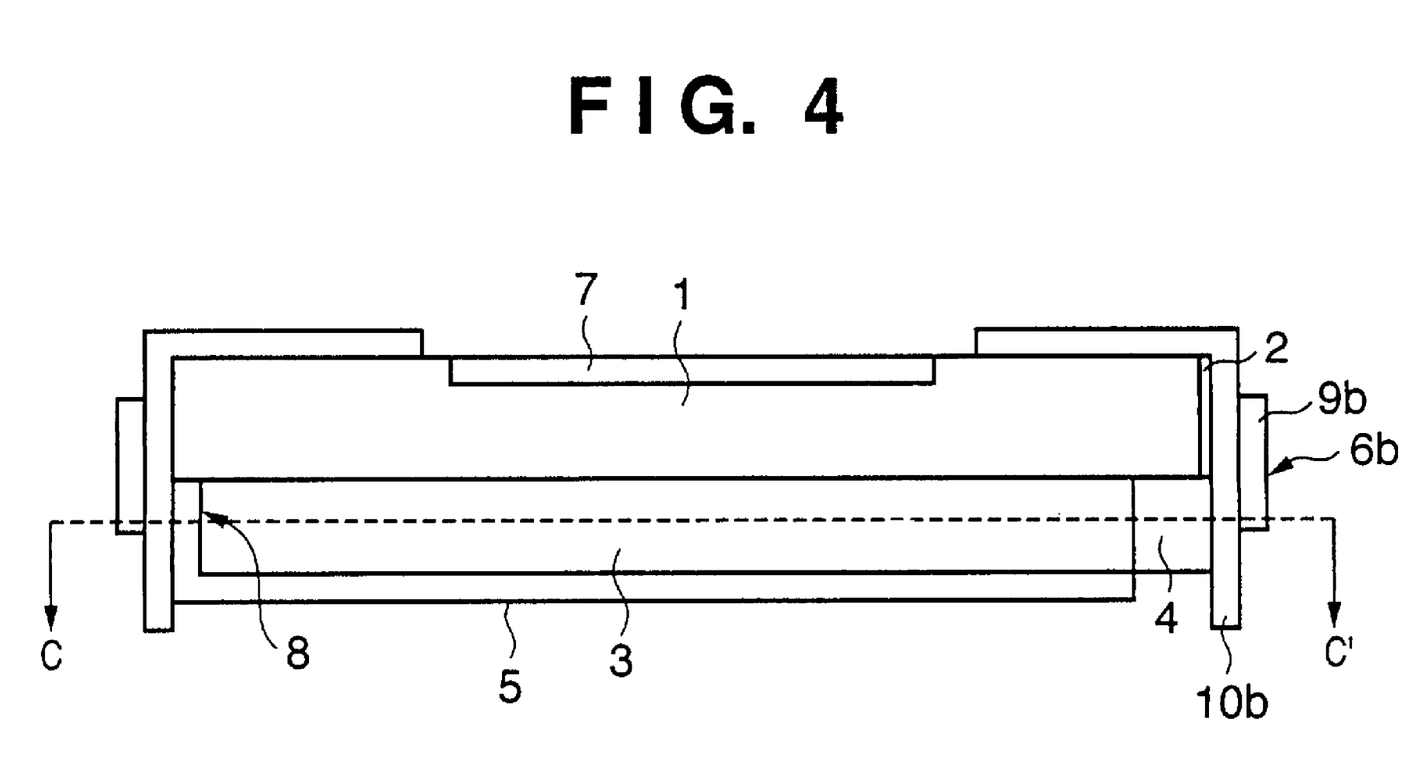
FIG. 4 is a cross-sectional view (section B-B') of the preferred second embodiment of FIG. 3.

A radiation detection apparatus according to the preferred second embodiment of the present invention will now be described. FIG. 3 is a schematic plan view showing the radiation detection apparatus according to the preferred second embodiment of the present invention. For convenience of explanation, the electric components 6a and 6b are arranged in a plane. FIG. 4 is a cross-sectional view (section B-B') of the radiation detection apparatus of FIG. 3. In FIG. 3 and FIG. 4, the electric components 6a and 6b are actually mounted and arranged on the edge of a support substrate 1.

In the second embodiment, a light guiding plate (light guiding layer) 3 is arranged below the substrate (e.g., glass) 1 which has a plurality of pixels. Each pixel has a conversion element and a switching element such as a TFT. A reflective layer 5 and an edge reflective layer 8 located at the edge of the reflective layer 5 are arranged on the backside of the light guiding plate 3. These are distinct from the first embodiment. The light source 4 is arranged so as to emit light from the edge surface of the light guiding plate 3.

The material of the light guiding plate 3 may be a transparent material (e.g., acrylic or glass) with a refractive index different from that of air. Arranging the light guiding plate 3 in this way enables the number of light sources to be decreased dramatically. Therefore, it is possible to further suppress noise generated by a readout circuit due to the light source 4 or the driving circuit thereof.

The present invention is not limited to the above-mentioned embodiments and can have the following arrangement.

Figure 5:
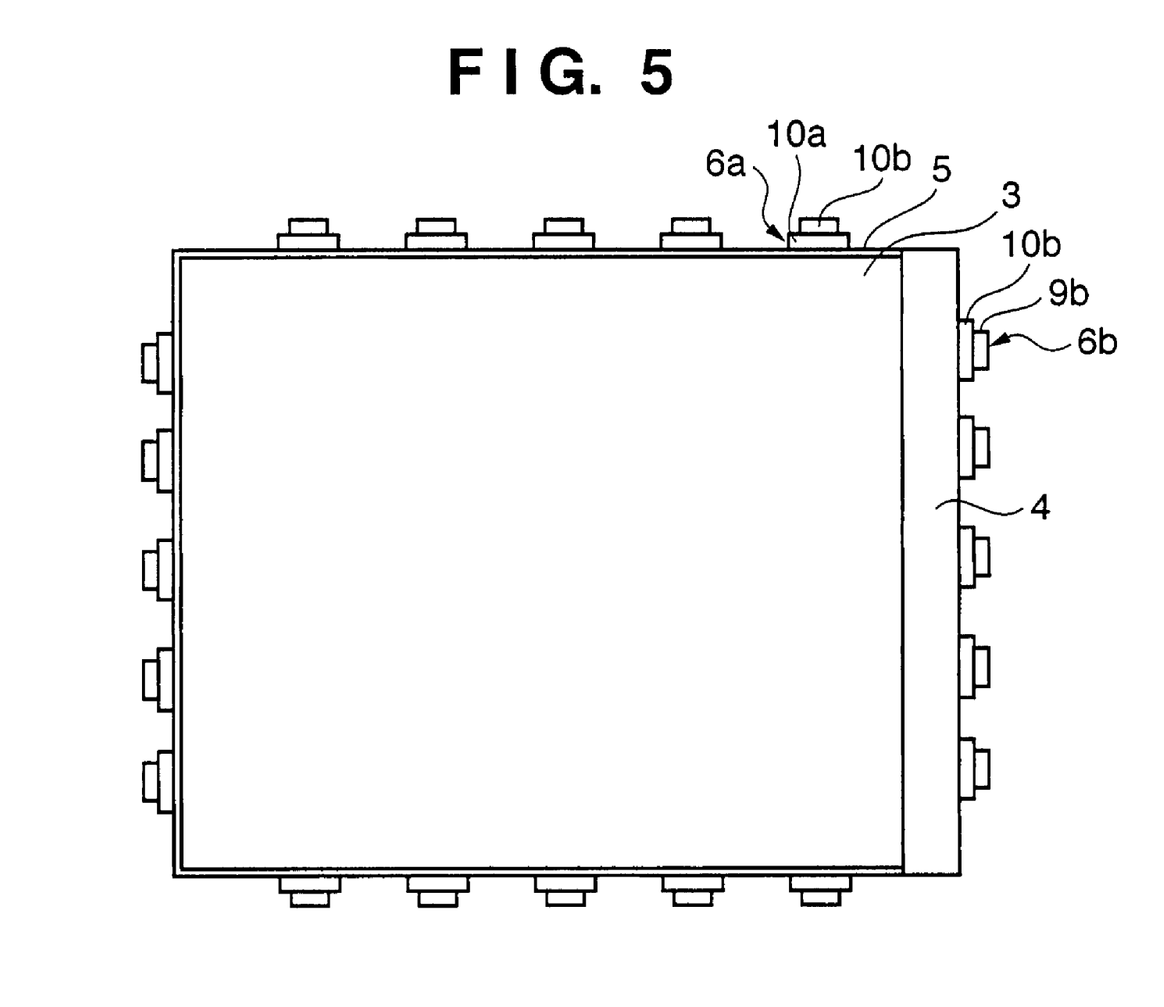
FIG. 5 is a cross-sectional view (section C-C') of the preferred second embodiment of the present invention using a line source.

FIG. 5 is a cross-sectional view of the radiation detection apparatus described in the second embodiment, which is taken along a line C-C' in FIG. 4. The light source 4 includes a line source. For example, an LED light source, a cold-cathode tube, and an EL (Electro-Luminescence) light source are usable as the light source 4. The light source 4 includes a single light source or continuously arranged light sources and therefore can uniformly irradiate the conversion elements.

Figure 6:
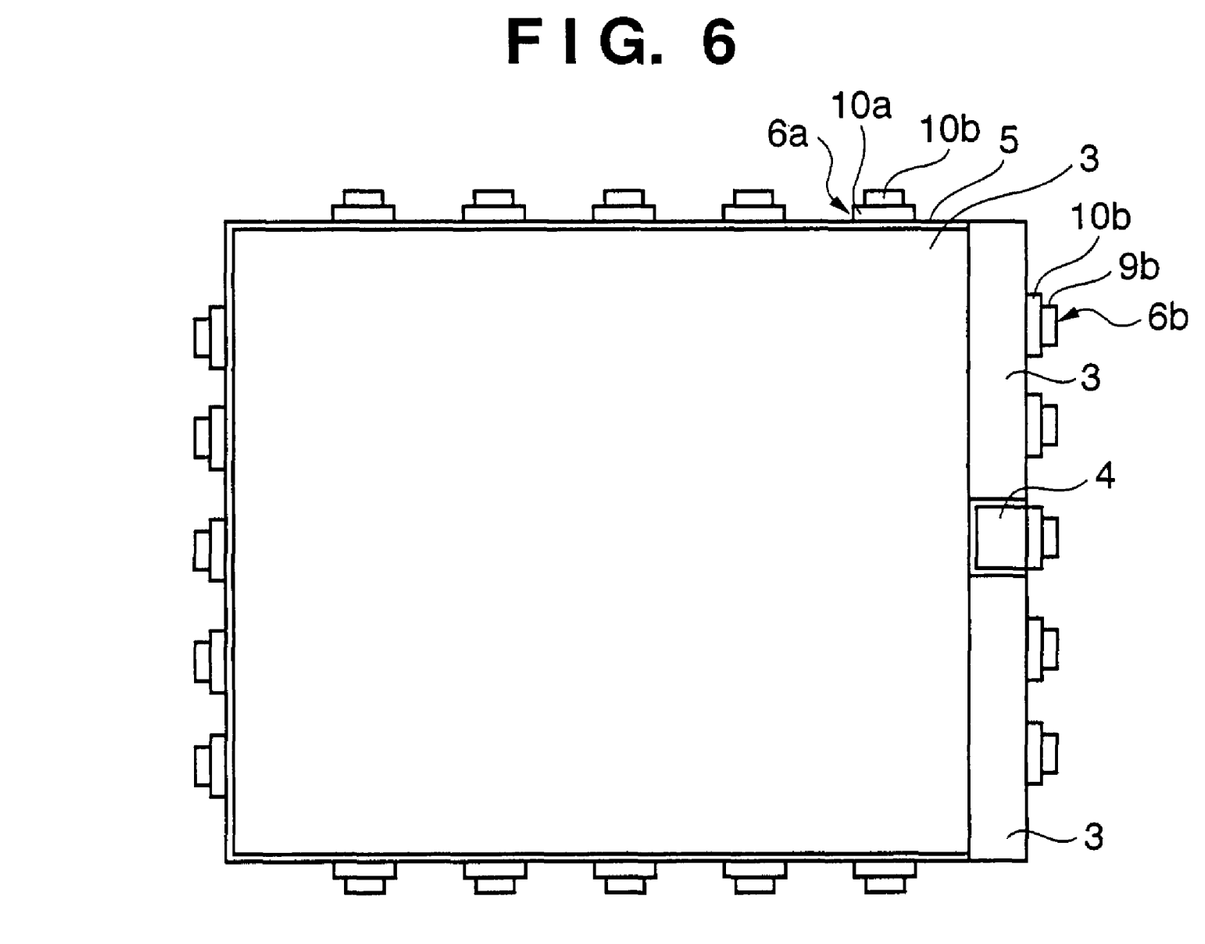
FIG. 6 is a cross-sectional view (section C-C') of the preferred second embodiment of the present invention using a point source.

FIG. 6 is a cross-sectional view of the radiation detection apparatus described in the second embodiment, which is taken along a line C-C' in FIG. 4. The light source 4 includes a point source. Light emitted from the light source 4 uniformly irradiates the conversion elements through the light guiding plate 3. Use of a point source as the light source 4 can minimize the number of light sources 4. This makes it possible further to suppress noise generated in the readout circuit by the light source 4 or the driving circuit thereof. In FIG. 6, the light source 4 includes one point source. However, this is merely an example of the preferred embodiment of the present invention, and the present invention is not limited to this. The light source 4 may include a plurality of point sources.

Figure 7:
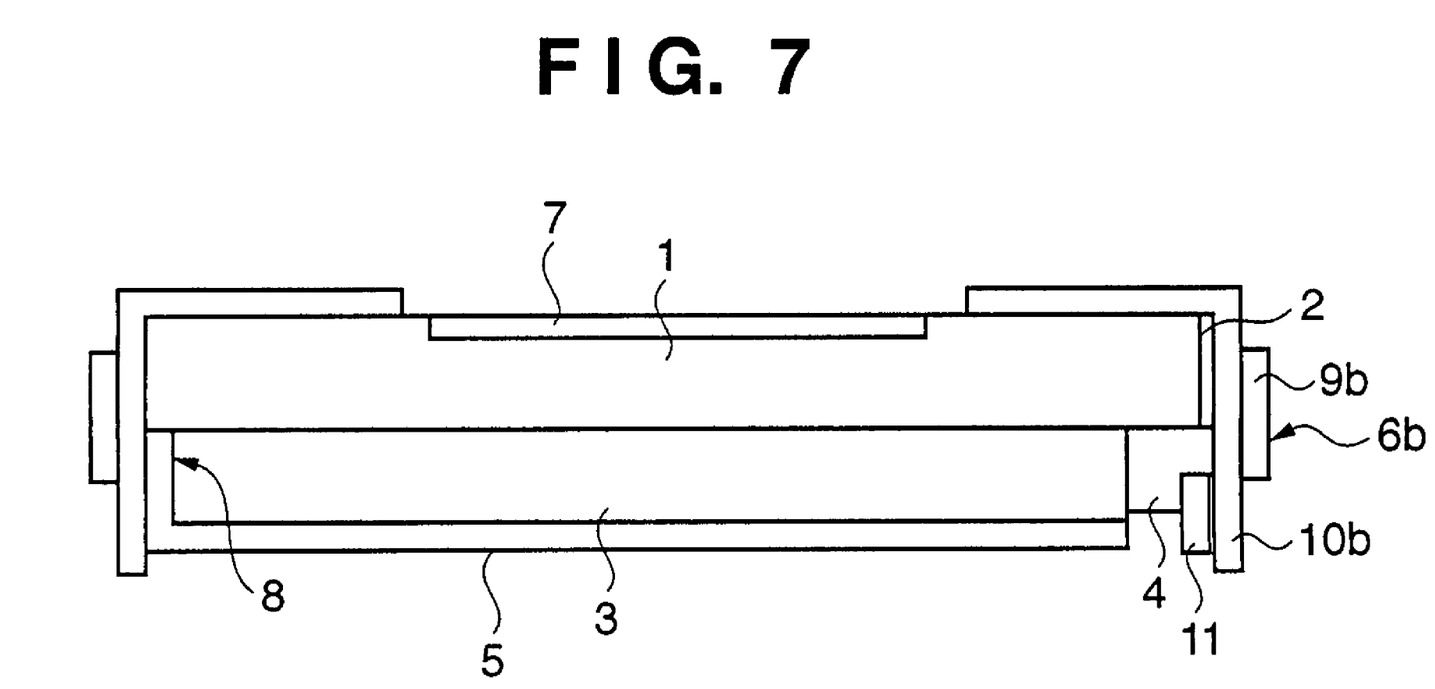
FIG. 7 is a cross-sectional view of an arrangement of a driving circuit of a light source.

It is also preferable to arrange a driving circuit 11 of the light source 4 on the side of the electric component 6b away from the readout circuit as shown in FIG. 7. This arrangement further suppresses noise generated in the readout circuit by the driving circuit 11 of the light source 4.

Third Embodiment

A radiation detection apparatus according to the third embodiment of the present invention will be described. In the third embodiment, a driving wire to drive a light source is located away from a readout circuit. More specifically, the driving wire to drive the light source is arranged to face any regions of the backside of the substrate 1 except a region of the substrate surface where electric components with readout circuits are arranged. This arrangement suppresses noise generated in the readout circuit by the driving wire to drive the light source. An example of this arrangement will be described below with reference to FIG. 8.

Figure 8:
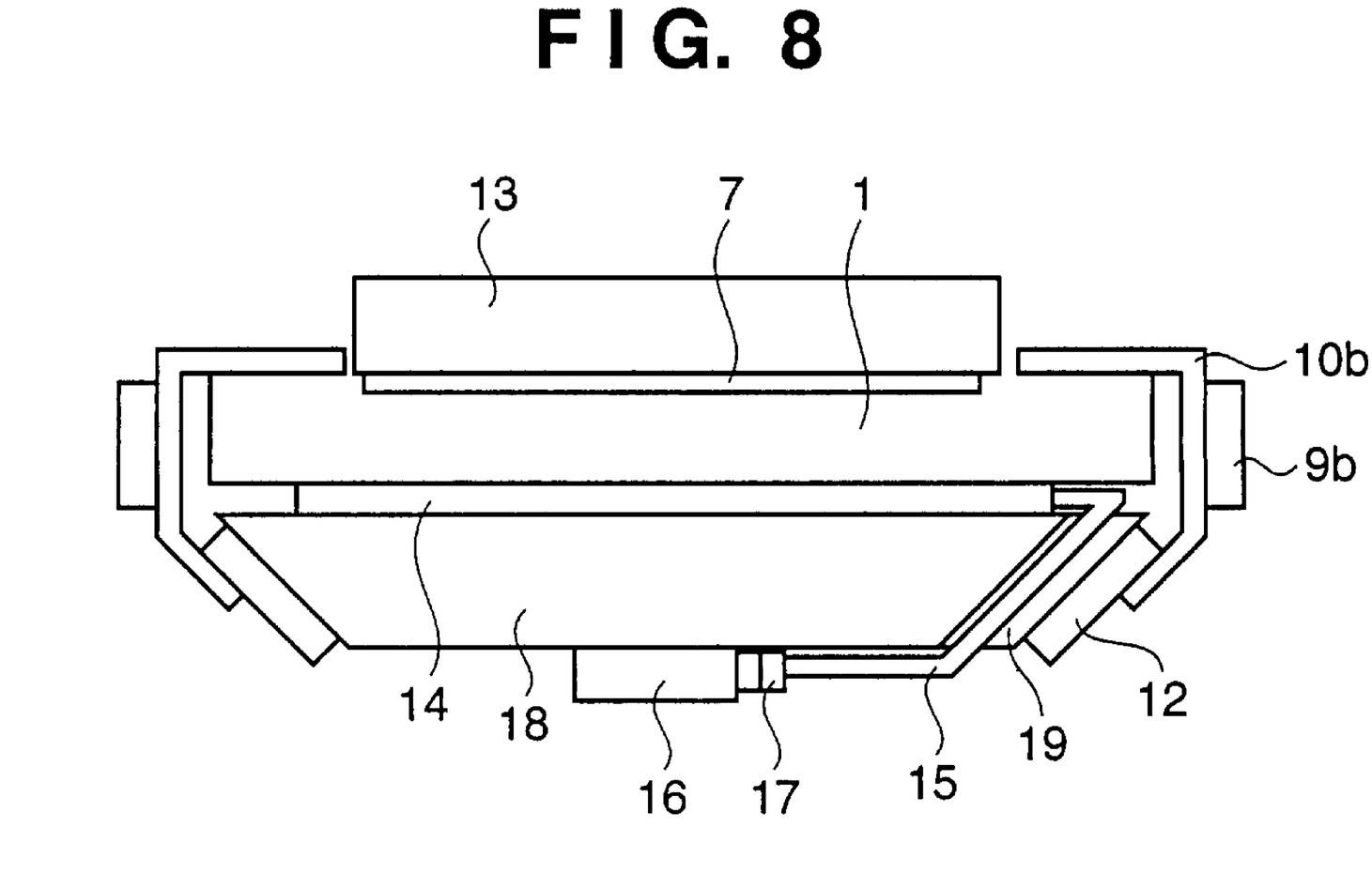
FIG. 8 is a cross-sectional view of a preferred third embodiment of the present invention.

FIG. 8 is a sectional view of a radiation detection apparatus according to the third embodiment. An EL (Electro-Luminescence) sheet 14 serving as a light source is arranged under a glass substrate 1 having a plurality of pixels having photoelectric conversion elements or TFTs. A support plate 18 to support the EL sheet 14 is arranged under it. The EL sheet 14 preferably contains a metal such as a magnesium alloy. An EL driving wire 15 running from the EL sheet 14 is routed inside a trench 19, i.e., a notch in the support plate 18 without interfering with the TFT driving PCB and TFT driving TCP and connected to an EL driving power supply 16.

A connector 17 used to connect the EL driving wire 15 to the EL driving power supply 16 facilitates maintenance in case of failure. Since it is possible to separately mount the EL sheet 14 and EL driving power supply 16, the workability improves.

As described above, arranging the EL driving wire 15 away from the readout circuit suppresses noise generated in the readout circuit. Additionally, the support plate 18 containing a metal and inserted between the EL driving wire 15 and a pixel region 7 shields electromagnetic waves from the EL driving wire 15. This suppresses noise generated in the pixels and further suppresses noise generated in the readout circuit.

Arranging the EL driving power supply 16 far from the readout circuit suppresses noise generated in the readout circuit. Additionally, the support plate 18 containing a metal and inserted between the EL driving power supply 16 and the pixel region 7 suppresses noise generated in the pixels and further suppresses noise generated in the readout circuit, as described above.

A wavelength converter 13 above the substrate 1 converts radiation that contains image information and enters from the upper side in FIG. 8 into light with a wavelength detectable by the photoelectric conversion elements.

Figure 9:
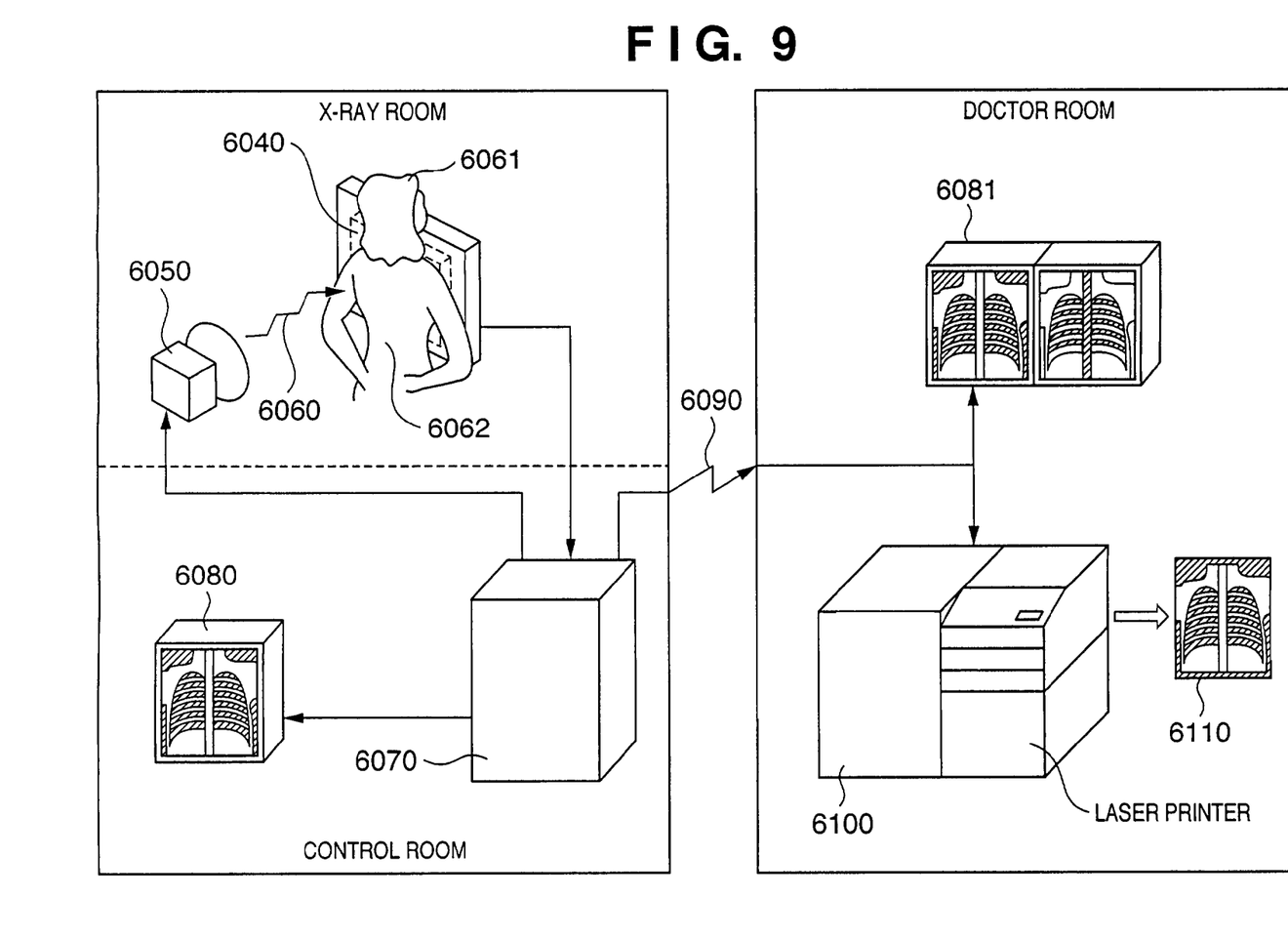
FIG. 9 illustrates an exemplary radiation detection system using the radiation detection apparatus of a preferred embodiment of the present invention.

FIG. 9 is a view showing an application example of the radiation detection system according to the preferred embodiment of the present invention to a radiation detection system.

Described below is the feature of the radiation detection system. More specifically, X-rays 6060 generated by a radiation generator 6050 such as an X-ray tube pass through an observing part 6062 such as a chest of a patient or a subject 6061, and is incident on an image sensor 6040. Incident X-rays contain internal information on the subject 6061. The image sensor 6040 obtains electrical information in accordance with the incident X-rays. This information is converted into a digital signal. An image processor 6070 performs an image process for the converted signal and outputs the processed signal to a display 6080 in a control room such that the user can observe the image displayed on the display 6080.

In addition, the image processor 6070 can transfer the processed signal output from the image processor 6070 to, for example, a remote place via a transmission processing means 6090 such as a telephone line and wireless. The transferred signal is then displayed on a display 6081 or outputted to, for example, a film, and allows a doctor at a remote place such as a doctor room other than the control room to perform diagnosis. The information obtained in the doctor room can also be recorded or saved by a recording means 6100 on a recording medium 6110 such as an optical disk, a magnetic optical disk, a magnetic disc or a recording medium 6110 such as a film and paper.

The radiation imaging apparatus according to the preferred embodiments of the present invention is arranged in the image sensor 6040. The image processor 6070 performs an image process for the A/D converted digital signal for any purpose.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-367190 filed on Dec. 20, 2005, which is hereby incorporated by reference herein in its entirety.

The invention claimed is:

1. A radiation detection apparatus comprising:
a substrate having a conversion element on a first surface, the conversion element configured to convert radiation into electric charges;
a readout circuit configured to read out the electric charges and connected to a first region that includes a first edge of the first surface;
a driving circuit configured to drive the conversion element and connected to a second region that is not the first region, the second region including a second edge of the first surface; and
a light source configured to generate light to be emitted to the conversion element and arranged on a side of a second surface of the substrate which opposes the first surface of the substrate wherein the light source is arranged so as to face the second region or arranged on the second surface.

2. The apparatus in claim 1, wherein the conversion element directly converts radiation into electric charges.

3. The apparatus in claim 1, further comprising a light guiding layer arranged on the side of the second surface, the light guiding layer guiding light from the light source.

4. The apparatus in claim 3, further comprising a reflective layer on the opposite side of the substrate side of the light guiding layer.

5. The apparatus in claim 1, further comprising an electric component arranged on the second edge of the first surface, wherein the light source is arranged on the electric component.

6. The apparatus in claim 5, wherein the electric component is fixed to the substrate with an adhesion layer.

7. The apparatus in claim 1, further comprising an edge reflective layer arranged on an edge of the substrate.

8. The apparatus in claim 1, further comprising a driving wire for driving the light source.

9. The apparatus in claim 8, further comprising a driving power supply connected to the driving wire,
wherein the driving power supply is arranged so as to face any regions on the side of the second surface except the first region.

10. The apparatus in claim 1, further comprising a support plate supporting the light source,
wherein the light source is arranged on the second surface, and
the support plate comprises metal.

11. A radiation detection system comprising:
a radiation detection apparatus defined in claim 1;
a signal processing unit configured to process a signal from the radiation detection apparatus;
a recording unit configured to record a signal from the signal processing unit;
a display unit configured to display a signal from the signal processing unit; and
a transmission unit configured to transmit a signal from the signal processing unit.

12. The apparatus in claim 5, further comprising a driving circuit of the light source arranged on the side of the electric component.

13. The apparatus in claim 1, wherein
the radiation is emitted to the conversion element from the opposite side of the substrate side of the conversion element; and
light from the light source is emitted to the conversion element from the substrate side of the conversion element.

14. The apparatus in claim 1, wherein
the conversion element is a photoelectric conversion element, and
the apparatus further comprises a scintillator arranged on the opposite side of the substrate side of the photoelectric conversion element for converting radiation into light at a wavelength range which can be sensed by the conversion element.

15. A radiation detection apparatus comprising:
a substrate having a conversion element on a first surface, the conversion element configured to convert radiation into electric charges;
a readout circuit configured to read out the electric charges and connected to a first region including a first edge of the first surface;
a driving circuit configured to drive the conversion element and connected to a second region that is not the first region, the second region including a second edge of the first surface; and
a light source configured to generate light to be emitted to the conversion element and arranged on a side of a second surface of the substrate which opposes the first surface of the substrate wherein the light source is arranged so as to face the second region.

* * * * *